US011913974B2

(12) United States Patent
Lemmon et al.

(10) Patent No.: US 11,913,974 B2
(45) Date of Patent: Feb. 27, 2024

(54) APPARATUS AND METHOD FOR EMBEDDING CURRENT MEASUREMENT AND RINGING SUPPRESSION IN MULTICHIP MODULES

(71) Applicant: THE BOARD OF TRUSTEES OF THE UNIVERSITY OF ALABAMA, Tuscaloosa, AL (US)

(72) Inventors: Andrew N. Lemmon, Tuscaloosa, AL (US); Ali Shahabi, Tuscaloosa, AL (US)

(73) Assignee: The Board of Trustees of The University of Alabama, Tuscaloosa, AL (US)

( * ) Notice: Subject to any disclaimer, the term of this patent is extended or adjusted under 35 U.S.C. 154(b) by 520 days.

(21) Appl. No.: 17/044,133

(22) PCT Filed: Apr. 3, 2019

(86) PCT No.: PCT/US2019/025482
§ 371 (c)(1),
(2) Date: Sep. 30, 2020

(87) PCT Pub. No.: WO2019/195357
PCT Pub. Date: Oct. 10, 2019

(65) Prior Publication Data
US 2021/0057986 A1 Feb. 25, 2021

Related U.S. Application Data

(60) Provisional application No. 62/652,125, filed on Apr. 3, 2018.

(51) Int. Cl.
*G01R 15/18* (2006.01)
*G01R 1/22* (2006.01)
(Continued)

(52) U.S. Cl.
CPC ............. *G01R 15/183* (2013.01); *G01R 1/22* (2013.01); *G01R 15/181* (2013.01); *H01F 38/28* (2013.01);
(Continued)

(58) Field of Classification Search
CPC ...... G01R 15/183; G01R 1/22; G01R 15/181; H02M 1/0009; H02M 1/44; H02M 3/158;
(Continued)

(56) References Cited

U.S. PATENT DOCUMENTS 5,936,853 A 8/1999 Mweene
9,146,294 B2 9/2015 Klapatch et al.
(Continued)

OTHER PUBLICATIONS

Emmon, A.N., and Shahabi, A., "Technique for Embedding Current Measurement and Ringing Suppression within Muttichip Modules." 2017 International Workshop on Integrated Power Packaging (IWIPP) [online] Jun. 1, 2017 (Jun. 1, 2017) <URL: https://Ieeexplore.ieee.org/abstract/document/7936766>.
(Continued)

*Primary Examiner* — Raul J Rios Russo
(74) *Attorney, Agent, or Firm* — Meunier Carlin & Curfman LLC

(57) ABSTRACT

The current disclosure relates to the design of an apparatus for enhancing the operation and reliability of high-power multi-chip modules, which are used in the design and implementation of power electronics converters. This apparatus is especially useful for modules containing recently commercialized, high-performance wide band-gap semiconductors such as Silicon Carbide (SiC), which commonly emit undesirable high-frequency ringing and oscillation in the "Near-RF" spectral band between 1-30 MHz. The disclosed apparatus provides near-complete elimination of this high frequency spectral content, while leaving the desired frequency range (1-100 kHz) of the module unaffected. In
(Continued)

addition to the suppression of this undesirable high-frequency content, the disclosed apparatus also provides for accurate, galvanically-isolated, high-bandwidth, real-time current measurement, which is essential for some types of power electronics converters. The apparatus disclosed here provides ringing suppression and current measurement in simple circuit topology that can be implemented compactly inside the geometry of a multi-chip power module.

5 Claims, 14 Drawing Sheets

(51) Int. Cl.
   *H01F 38/30* (2006.01)
   *H01F 38/28* (2006.01)

(52) U.S. Cl.
   CPC ........ *H01F 38/30* (2013.01); *H01F 2038/305* (2013.01)

(58) Field of Classification Search
   CPC ......... H02M 7/48; H02M 1/348; Y02B 70/10; H01F 38/30; H01F 38/28; H01F 2038/305
   USPC .... 324/72, 76.11–76.83, 115, 126, 127, 129, 324/149
   See application file for complete search history.

(56) References Cited

U.S. PATENT DOCUMENTS

| | | | | |
|---|---|---|---|---|
| 2007/0053217 | A1* | 3/2007 | Darroman | H02M 3/158 363/62 |
| 2012/0049834 | A1* | 3/2012 | Pommerenke | H02M 1/34 323/311 |
| 2014/0369093 | A1* | 12/2014 | Park | H02M 1/34 363/50 |
| 2018/0262100 | A1* | 9/2018 | Stanley | H02M 3/158 |
| 2019/0020265 | A1* | 1/2019 | Ikarashi | H02M 3/335 |

OTHER PUBLICATIONS

International Search Report and Written Opinion issued in PCT/US2019/025482, dated Jun. 28, 2019, 10 pages.
A. N. Lemmon, A. Shahabi and K. Miskell, "Multi-branch inductance extraction procedure for multi-chip power modules," in Proc. Workshop on Wide Bandgap Power Devices and Applications (WiPDA), Fayetteville, AR, 2016, pp. 95-100.
S. Ziegler, R. C. Woodward, H. H. C. Iu and L. J. Borle, "Current Sensing Techniques: A Review," in IEEE Sensors Journal, vol. 9, No. 4, pp. 354-376, Apr. 2009.
S. Ziegler, "New current sensing solutions for low-cost high-power-density digitally controlled power converters" Ph.D. dissertation, school of Elect., Electronics and Comp. Engin., The Univ. of Western Australia, Perth, Australlia, 2009.
J. A. Ferreira, W. A. Cronje and W. A. Relihan, "Integration of high frequency current shunts in power electronic circuits," in IEEE Transactions on Power Electronics, vol. 10, No. 1, pp. 32-37, Jan. 1995.
C. M. Johnson and P. R. Palmer, "Current measurement using compensated coaxial shunts," in IEEE Proceedings of Science, Measurement and Technology, vol. 141, No. 6, pp. 471-480, Nov. 1994.
Kwok-Wai Ma and Yim-Shu Lee, "Technique for sensing inductor and DC output currents of PWM DC-DC converter," in IEEE Transactions on Power Electronics, vol. 9, No. 3, pp. 346-354, May 1994.
N. McNeill, N. K. Gupta and W. G. Armstrong, "Active current transformer circuits for low distortion sensing in switched mode power converters," in IEEE Transactions on Power Electronics, vol. 19, No. 4, pp. 908-917, Jul. 2004.
P. A. Tipler, An introduction to the Hall effect, Bell Technologies, Inc., 2005. [Online]. Available: http://www.fwbell.com.
R. S. Popovic, Z. Randjelovic, and D. Manic, "Integrated Hall-effect magnetic sensors," in Sensors and Actuators A: Physical, vol. 91, pp. 46-50, 2001.
J. Kim, A Damping Scheme for switching Ringing of Full SiC MOSFET by Air Core PCB circuit, in IEEE Transactions on Power Electronics, Issue 99, 2017.
A. J. Hanson, J. A. Belk, S. Lim, C. R. Sullivan, and D. J. Perreault, "Measurements and Performance Factor Comparisons of Magnetic Materials at High Frequency," IEEE Trans. Power Electron., vol. 31, No. 11, pp. 7909-7924, 2016.
A. Lemmon, R. Cuzner, J. Gafford, R. Hosseini, M. Mazzola, "Methodology for Characterization of Common-Mode Conducted Electromagnetic Emissions in Wide-Band-Gap Converters for Ungrounded Shipboard Applications," in IEEE Journal of Emerging and Selected Topics in Power Electronics, vol. PP, No. 99, pp. 1-16, Jun. 2017.
K. Madjour, "Silicon Carbide Market Update: From Discrete Devices to Modules," in Proc. Power Conversion & Intelligent Motion Europe, 2014.
A. Lemmon, M. Mazzola, J. Gafford, and C. Parker, "Ensuring Volt-Second Balance in High-Power-Density Phase-Shifted Full-Bridge Converter Design," in Proc. IEEE Applied Power Electronics Conference and Exposition (APEC), 2014, pp. 2919-2925.
M. Hollander, "High frequency oscillations measured with high bandwidth current sensors at low current," Hollander Research, Apr. 2014.
M. Billman, "Coaxial shunts from T&M Research Products, Inc.," Nov. 2003.

\* cited by examiner

APPARATUS AND METHOD FOR EMBEDDING CURRENT MEASUREMENT AND RINGING SUPPRESSION IN MULTICHIP MODULES

BACKGROUND

Field

The present disclosure relates to a current transformer for power electronics applications, specifically a current transformer that also provides suppression of undesired signal content, in addition to the principal role of the current transformer, which is the measurement of current.

With the commercialization of wide band-gap (WBG) semiconductors, a new promising horizon has been opened to power electronics application designers. For the full potential of this technology to be exploited for high-power applications, multi-chip power modules (MCPM's) are required. MCPM's bring provide several advantages to high-power applications, including compactness, thermal performance, mechanical stability, and increased operational life. Efforts to optimize MCPM's for wide band-gap semiconductors have made significant progress over the last several years; however, some challenges remain. For example, the very fast di/dt and dv/dt rising edges, introduced by Silicon Carbide (SiC) MOSFET's, can easily excite resonances in parasitic elements, causing ringing and overshoot during the switching transients, and consequently impeding the desired application functionality. Even for an optimized structure such as an MCPM, in which parasitic inductances of traces have been minimized to the extent possible, this challenge usually remains a concern [1]. Therefore, additional techniques to mitigate this behavior and improve the transient response of WBG-based MCPM's are needed.

On the other hand, in many power converter topologies, high-bandwidth, real-time current measurement is a requirement for control. Several options are available to engineers for this purpose [1][3]. Resistive shunts [4][5] offer high bandwidth but no galvanic isolation; traditional current transformers (CT) [6][7] provide galvanic isolation but require a mechanical choke-point in the power bus which increases loop inductance (which degrades the transient behavior of WBG circuits) and exacerbates undesirable signal content; and hall-effect sensors [8] [9] are only suitable for measuring currents with modest bandwidth (kHz).

BRIEF SUMMARY

Accordingly, the present disclosure is directed to apparatus and method for embedding current measurement and ringing suppression in multichip modules that obviates one or more of the problems due to limitations and disadvantages of the related art.

In accordance with the purpose(s) of this disclosure, as embodied and broadly described herein, this invention, in one aspect, relates to a current measurement and ringing suppression device for use in a multi-chip power module which includes a magnetic core current transformer having an insertion impedance Zin and turns ratio N, a burden resistor having resistance $R_B$ and a filter, the filter comprising a capacitance $C_P$, an impedance $L_P$ and a resistance $R_P$; wherein $C_P$, $L_P$ and $R_P$ are selected such that Zin remains above a minimum effective value across a known frequency range; wherein current measurement is taken across the burden resistor.

In another aspect, the invention relates to a multichip power module which includes a plurality of multi-chip power module terminals; a magnetic-core-based current transformer having an insertion impedance Zin and turns ratio N, a burden resister having resistance $R_B$ and a filter, the filter comprising a capacitance $C_P$, an inductance $L_P$ and a resistance $R_P$; wherein $C_P$, $L_P$ and $R_P$ are selected such that Zin remains above a minimum effective value across a known frequency range; wherein current measurement is taken across the burden resistor; wherein the magnetic core current transformer is positioned around a portion of at least one of the multi-chip power module terminals.

In yet another aspect, the invention relates to a method of measuring current and snubbing in a multi-chip power module, the multi-chip power module comprising a magnetic core current transformer having an insertion impedance Zin and turns ratio N, a burden resister having resistance $R_B$ and a filter, the filter comprising a capacitance $C_P$, an inductance $L_P$ and a resistance $R_P$; wherein $C_P$, $L_P$ and $R_P$ are selected such that $|Zin| \approx N^2 \cdot R_B$, the method comprising attaching the current transformer to the system for which measurement is desired; and measuring the voltage across the burden resistor RB; and mathematically scaling the voltage across the burden resistor RB to represent the predicted current value in the primary circuit.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

An advantage of the present invention is to provide apparatus and method for embedding current measurement and ringing suppression in multichip modules.

Further embodiments, features, and advantages of the apparatus and method for embedding current measurement and ringing suppression in multichip modules as well as the structure and operation of the various embodiments of the Apparatus and method for embedding current measurement and ringing suppression in multichip modules, are described in detail below with reference to the accompanying drawings.

It is to be understood that both the foregoing general description and the following detailed description are exemplary and explanatory only and are not restrictive of the invention as claimed.

BRIEF DESCRIPTION OF THE DRAWINGS

The accompanying figures, which are incorporated herein and form part of the specification, illustrate apparatus and method for embedding current measurement and ringing suppression in multichip modules. Together with the description, the figures further explain the principles of the apparatus and method for embedding current measurement and ringing suppression in multichip modules described herein and thereby enable a person skilled in the pertinent art to make and use the Apparatus and method for embedding current measurement and ringing suppression in multichip modules.

DETAILED DESCRIPTION

Figure 1:
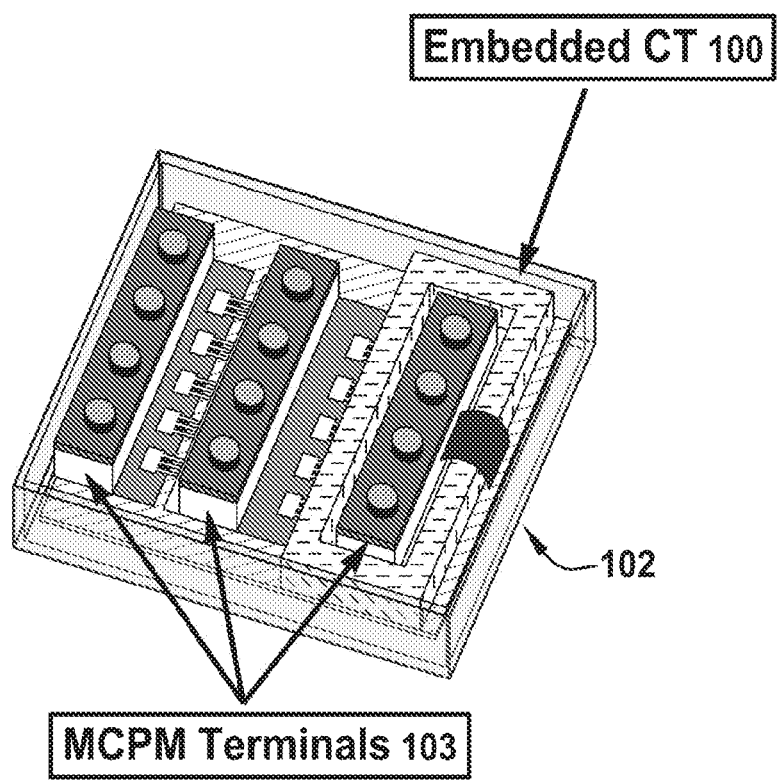
FIG. 1 illustrates a CT-snubber according to principles of the present disclosure in a multi-chip power module (MCPM).

Reference will now be made in detail to embodiments of the apparatus and method for embedding current measurement and ringing suppression in multichip modules with reference to the accompanying figures, in which like reference numerals indicate like elements.

According to principles of the present disclosure, a current transformer (CT) can be fitted around an internal terminal within a multi-chip power module (MCPM). According to novel principles described herein, high-bandwidth current measurement can be performed without the need for introducing an undesirable geometric choke-point in the external bussing.

An illustration of an exemplary CT-snubber 100 embedded in the MCPM 102 is provided as FIG. 1. As can be seen in the illustration, the CT is embedded around the terminals 103 of the MCPM, taking advantage of an existing, necessary constriction in the system where current flows through the terminals, rather than establishing another choke-point specifically for current measurement, as in conventional designs (e.g. to enter the aperture of the CT).

The greater opportunity, moreover, arises when recognizing that the frequency response of a traditional CT can be described as a bandpass filter bounded by minimum and maximum cut-off frequencies. The bandpass is where the content of interest normally resides for accurate CT-based current measurement (the "measurement band"). However, by careful selection of current transformer (CT) properties and using a few additional components, this pass band can also be accompanied by a "suppression band", effectively utilizing the CT insertion impedance to suppress high-frequency (usually MHz range) spectral content. In this way, the undesirable high-frequency spectral content is suppressed, while still providing an accurate current measurement of the desired, lower-frequency content. This provides a similar damping effect to that offered by a traditional bus snubber, but with minimal impact for the desired converter behavior, and while simultaneously enabling a galvanically isolated, high-bandwidth current measurement. This solution can also be embedded within the MCPM packaging with minimal effect on the dimensions of the device. Moreover, the CT-Snubber will generally provide results similar to a traditional CT measurement in the measurement band. That is, frequency dependence of the CT can be used to discriminate between desired and undesired frequency components in the signal.

In a traditional CT design, there are only two degrees of freedom available to the designer to shape the bandpass of the sensor as well as the insertion impedance of the CT: the burden resistor value and the secondary turns ratio. A "CT-snubber" according to principles of the present disclosure contains additional degrees of freedom to provide further flexibility for shaping the frequency response of the sensor gain and the insertion impedance. This additional flexibility allows for: 1) measuring the current within a defined "measurement band" with sufficient accuracy, as will be described further herein; and 2) snubbing out or reducing undesirable high-frequency spectral content in a defined "suppression band". As rule of thumb, in many power electronics applications, the undesired high-frequency spectral content can usually be identified as that starting one order of magnitude higher than the switching frequency. This can be leveraged as a guideline to design any effective snubber. Specifically, an effective snubber is expected to present high impedance above a certain cut-off frequency to impede high frequency currents, while at the same time showing very low impedance below that cut-off frequency in order to avoid any negative side effects on the normal operation of the system.

At frequencies that fall into the measurement band, measurement behavior is expected from the CT-snubber, meaning that it should exhibit a low insertion impedance. This impedance should not fall below a certain point or the expected current measurement functionality may be compromised. At frequencies within the suppression band, the CT-snubber should exhibit high insertion impedance to suppress the undesired spectral content associated with parasitic-induced ringing. Therefore, it should be understood that each of these frequency regions should be adjusted properly in order to achieve an effective solution for an MCPM-embedded current measurement with ringing suppression capability.

Figure 2:
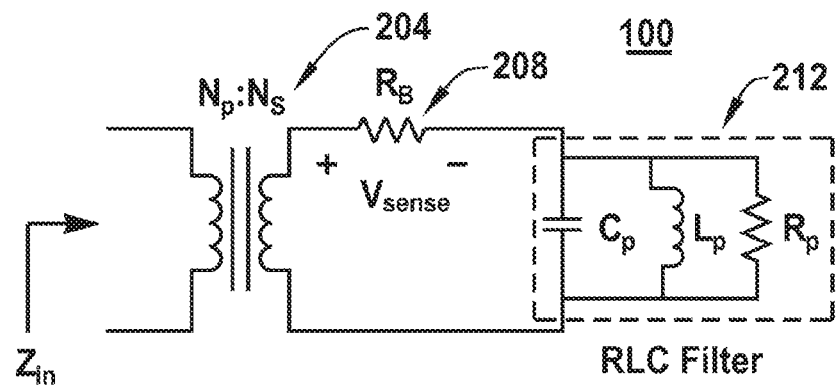
FIG. 2 is a schematic of an exemplary embodiment of a CT-snubber circuit according to principles described herein.

An equivalent circuit of the proposed CT-snubber 100 is depicted in FIG. 2. The current transformer 204 itself is represented by an ideal transformer, accompanied by a burden resistor 208, RB, and a parallel RLC filter 212 in the secondary to realize separation of the frequency response into a measurement band and a suppression band. The proposed CT-snubber 100 includes a magnetic coupler to provide a defined electrical relationship between the application (or "primary") side circuit and the measurement (or "secondary") side circuit. The primary coil has a first number of windings "turns" Np and the secondary coil has a second number of winding "turns" Ns. As is common in the art, the primary coil is comprised of a single turn, represented by a conductor in the application circuit which passes through the CT aperture. The secondary coil generally has a larger number of turns; a typical range of Ns for the present invention is in the range 10-100.

In general, the insertion impedance of the CT-snubber can be derived as:

$$Z_{in} = N^2 \cdot \left( R_B + \frac{R_P}{1 + j\left(\omega C_P R_P - \frac{R_P}{\omega L_P}\right)} \right) \quad (1)$$

Where N is the current transformer turns ratio (i.e. NP/NS); $R_B$ is the burden resistor; and $C_P$, $L_P$, and $R_P$ are the components of the parallel RLC "filter" portion of the CT-snubber shown in FIG. 2.

Figure 3:
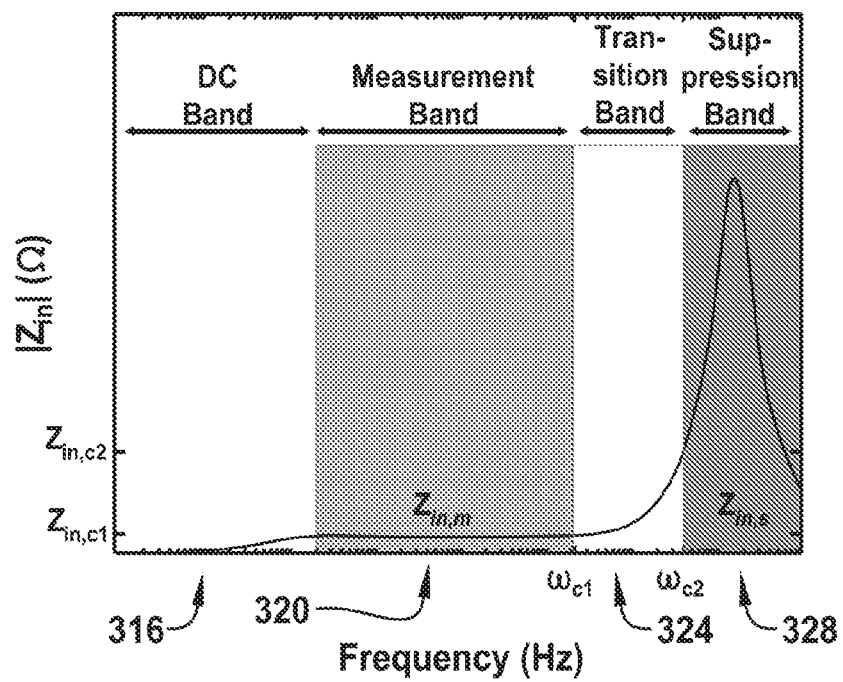
FIG. 3 is a graph illustrating exemplary insertion impedance of CT-snubber in the frequency domain and associated bands of influence.

In this context, according to principles of the present disclosure, the RLC filter 212 causes the CT insertion impedance $Z_{in}$ to spike at frequencies greater than the frequencies at which current measurement is performed, allowing the insertion impedance $Z_{in}$ to be separated into four different regions (frequency domains), as shown in FIG. 3. The first region is the DC band in which the insertion impedance of CT is almost zero due to the fact that a transformer is shorted out for very low frequencies. In this DC Band region 316, the CT-snubber is neither able nor expected to carry out any measurement:

$$|Z_{in,DC}| \approx 0 \quad (2)$$

The second region, known as the measurement band 320, is where accurate measurement performance is expected. One of the primary design goals for a traditional CT is attainment of a flat gain profile for the specified measurement bandwidth. Generally, such design goal for a traditional CT mitigates measurement error, which would otherwise accrue due to frequency-dependent CT gain. It should be noted that all CT's have frequency-dependent gain, since they exhibit gain roll-off both at low-frequency due to "droop" and at high-frequency due to shunt capacitance and magnetic circuit limits.

For the case of a CT with embedded suppression capability as described herein, the current measurement may be extracted from the CT-snubber by sampling the voltage across the burden resistor ($R_B$), just as in a traditional CT. Therefore, the RLC filter which appears in series with this element does not directly introduce measurement error in the sense of causing the measurement result to diverge from the physical behavior of the circuit. Provided that the transformer remains linear and the burden resistor ($R_B$) is reasonably modeled by an ideal resistance across the entire measurement band, the output ($V_{SENSE}$) will be a sufficiently accurate, scaled representation of the primary-side current; irrespective of whether any influence is exerted over the primary-side circuit by the CT-snubber (such as ringing suppression).

The RLC filter can influence the behavior of the primary-side current and cause the circuit to behave differently than it would without the CT-snubber in place. That is to say, the RLC filter provides a known "insertion impedance" which can restrict the flow of current within the primary portion of the CT-snubber in a manner which is frequency dependent. The frequency-dependent insertion impedance profile of the CT-snubber can be tailored by a designer to suppress known frequency ranges which contain undesirable content, such as the 1-30 MHz range, which is known to contain significant spurious emissions in applications based on WBG-based power electronics [12]. Within the measurement band, such an influence would be undesirable in part because it could result in significant dissipation within the CT-snubber. Assuming that the RLC filter is designed to exert minimal influence within the measurement band, the CT-snubber insertion impedance in this region can be defined solely by RB and the turns ratio:

$$|Z_{in,m}| \approx N^2 \cdot R_B \quad (3)$$

In the suppression band, it is intended for the CT-snubber to change its role to suppress undesirable spectral content. This goal is realized by incorporating a parallel RLC circuit in series with the burden resistor 108 as shown in FIG. 2. The RLC circuit is responsible for demarking the start and end frequencies for the high insertion impedance required for suppressing undesirable high-frequency content. As already mentioned, however, the impedance introduced by the parallel RLC should be very small within the measurement band to avoid impact on the intended operation of the circuit. A parallel RL circuit, instead of the parallel RLC circuit, can also be employed for this purpose. However, a practical implementation of any inductor is accompanied by some inter-winding capacitance, which can be modeled as equivalent parallel capacitance (EPC). At high frequencies, where the impedance of the EPC becomes comparable to the other components of a parallel RL circuit, the influence of this parasitic element cannot be neglected. Therefore, any practical implementation of a parallel RL circuit effectively turns into a parallel RLC circuit beyond a certain frequency. In this analysis, the capacitance in the depicted parallel RLC circuit represents the combination of inductor EPC and any additional capacitors that designer may need to employ. In the suppression band 328, the insertion impedance is dominated by the parallel RLC circuit, given as $$|Z_{in,z}| \approx N^2 \cdot \frac{R_P}{\sqrt{\left(1 + \left(\omega C_P R_P - \frac{R_P}{\omega L_P}\right)^2\right)}} \quad (4)$$

Also, as shown in FIG. 3, another region can also be identified in the insertion impedance profile of CT-snubber: the "transition band" 324. In the transmission band, the RLC filter 212 begins to exert some influence over the primary side of the circuit, but high insertion impedance is not yet achieved. The presence of this band could cause difficulty if the application has intended frequency content which is not well separated from the content desired for suppression. Fortunately, most power electronics applications involve significant separation between the desired content (at the switching frequency) and the undesired content (parasitic ringing). The transition band 324 can be described by the regime between two cut-off frequencies, $\omega c1$ and $\omega c2$, which exist at the upper and lower ends of this band 324. In general, the boundaries of this transition band will be defined on an application-specific basis. However, it might be reasonable to specify these boundaries in terms of the insertion impedance of the measurement band.

For example, $\omega_{c1}$ and $\omega_{c2}$ could be defined as the frequencies at which the insertion impedance reaches a factor of 1.05 and 10 times, the measurement-band insertion impedance, respectively:

$$\omega_{c1} = \omega|_{|Z_{in}|=1.05 \times |Z_{in,m}|} \quad (5)$$

$$\omega_{c2} = \omega|_{|Z_{in}|=10 \times |Z_{in,m}|} \quad (6)$$

The provided insertion impedance range is merely exemplary. In certain applications, a designer may determine that a different insertion impedance magnitude and/or is appropriate.

Figure 4A:
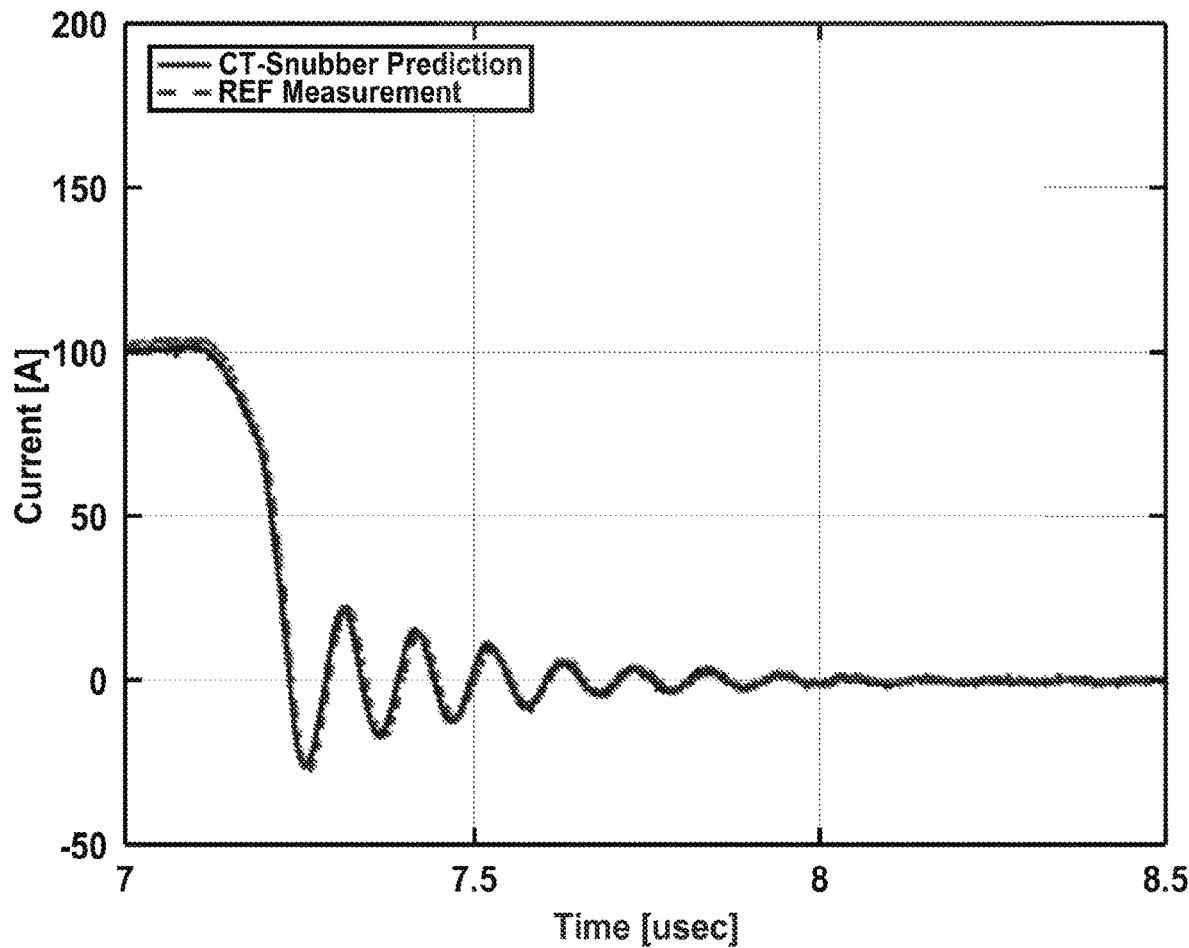
FIGS. 4(a) and 4(b) illustrate current measurement effectiveness of a CT-Snubber according to principles of the present disclosure. In this figure, the signal from a reference instrumentation shunt (dashed trace) is compared to the current signal predicted by the CT-snubber (solid trace).
Figure 4B:
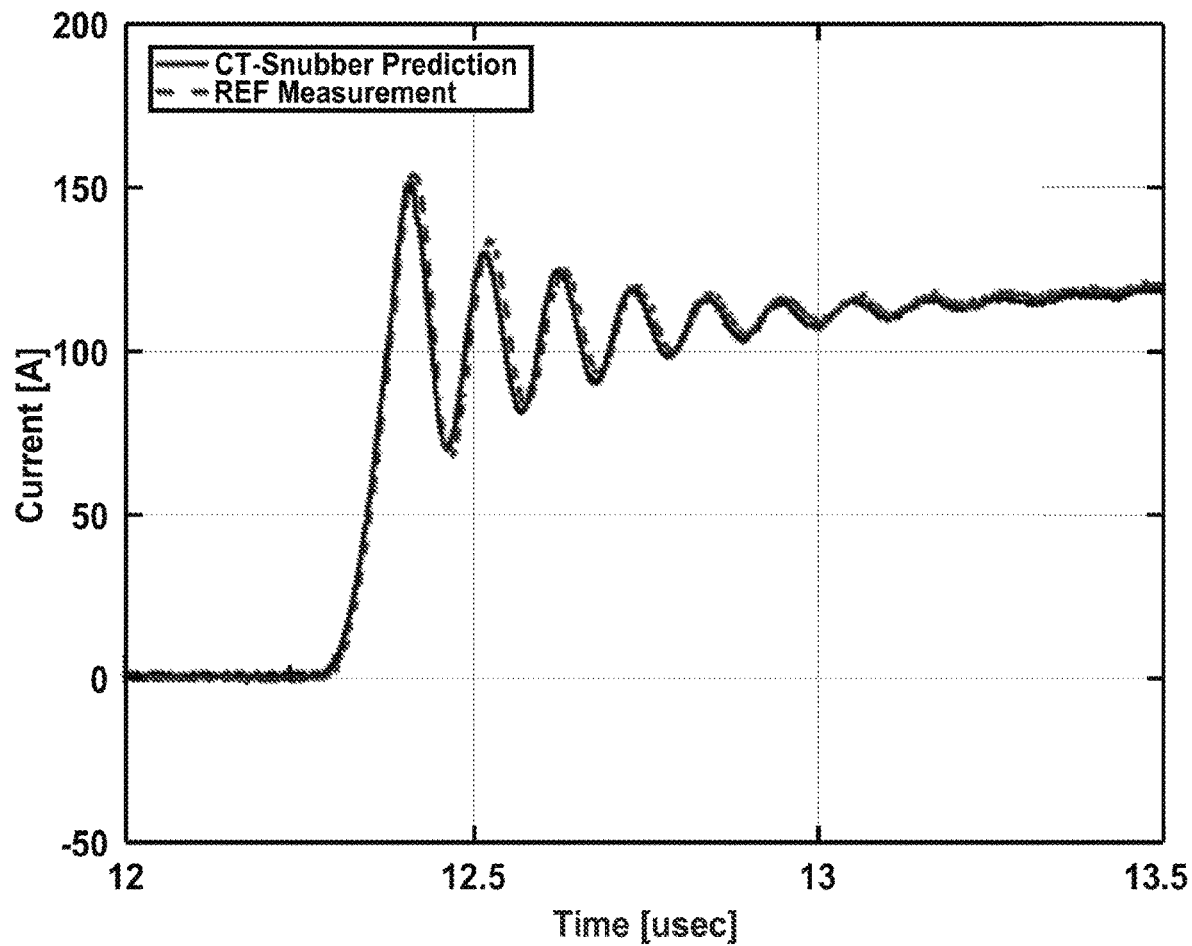

Current measurement effectiveness of a CT-Snubber according to principles of the present disclosure are illustrated in FIGS. 4(a) and 4(b). FIG. 4(a) is an example of rapidly decreasing current (semiconductor turn-off), and FIG. 4(b) is an example of rapidly increasing current (semiconductor turn-on). These figures demonstrate a comparison between the output of a traditional high-accuracy current measurement device (represented as "REF Measurement") and the current measurement output of the CT-Snubber. The good agreement observed between these two waveforms in this figure verifies that the CT-Snubber is able to accurately predict the current in the primary circuit, as would be expected for a traditional CT. It should be noted that the CT-snubber is able to accurately predict both the low-frequency (large amplitude) change as well as the high-frequency (oscillation) behavior of the primary circuit current. This example verifies that the CT-snubber has sufficient bandwidth to measure primary circuit current across a wide range of frequencies with high fidelity.

A set of empirical procedures was carried out to confirm the projected behavior of a CT-snubber device according to principles described herein. This empirical analysis consisted of two distinct operations. First, an exemplary CT-snubber 500, shown in FIG. 5, was characterized in the frequency domain to evaluate that impedance in the measurement band could be distinguished from impedance in the suppression band. Second, the exemplary CT-snubber was integrated into a high-power clamped-inductive load (CIL) test stand and its transient performance was evaluated during double-pulse testing of a high-performance silicon carbide (SiC) power module. The CT-snubber 500 was evaluated both for current measurement and for suppressing high-frequency ringing.

An exemplary CT-snubber module according to principles described herein was characterized in the frequency domain using a 120-MHz precision impedance analyzer, which is considered well-suited for determining the frequency-dependent profile of arbitrary linear circuit networks, including the effects of unknown parasitic elements.

Figure 5:
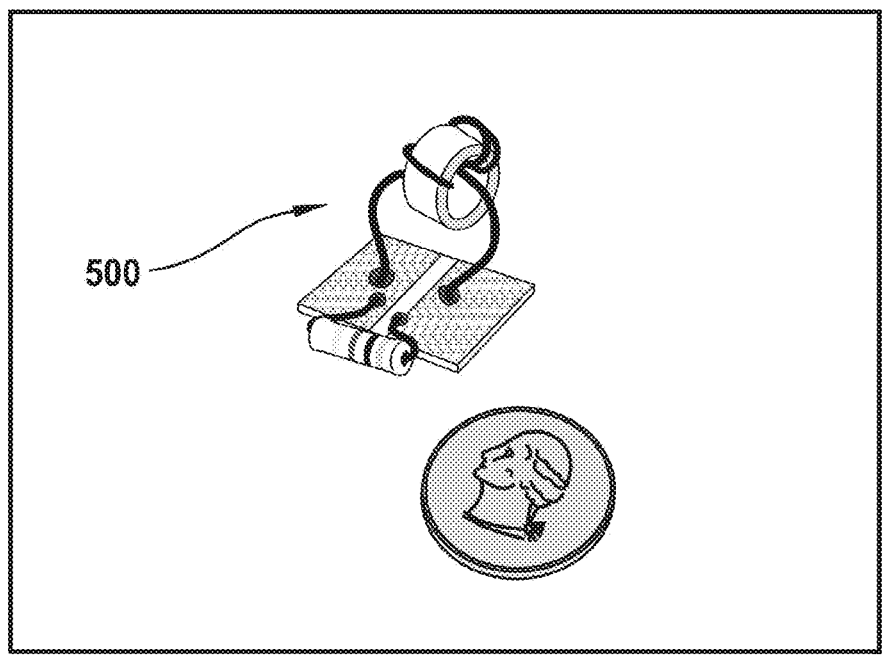
FIG. 5 shows a test prototype CT-Snubber according to principles of the present disclosure.

The CT-snubber hardware prototype is shown in FIG. 5. It should be noted that an earlier CT-snubber prototype (not shown) included both a burden resistor, as well as a parallel RLC filter network, as described previously in this paper. However, after the characterization process outlined here, it was determined that the inter-winding parasitic capacitance of the inductor within the CT-snubber was contributing significant capacitance to the parallel RLC network. This parasitic capacitance was found to be approximately an order of magnitude greater than the designed capacitance value of the filter. Therefore, the inductor was re-wound more sparsely with smaller gauge wire in order to minimize the turn-to-turn capacitance; and the discrete capacitor was removed from the CT-snubber.

Figure 6:
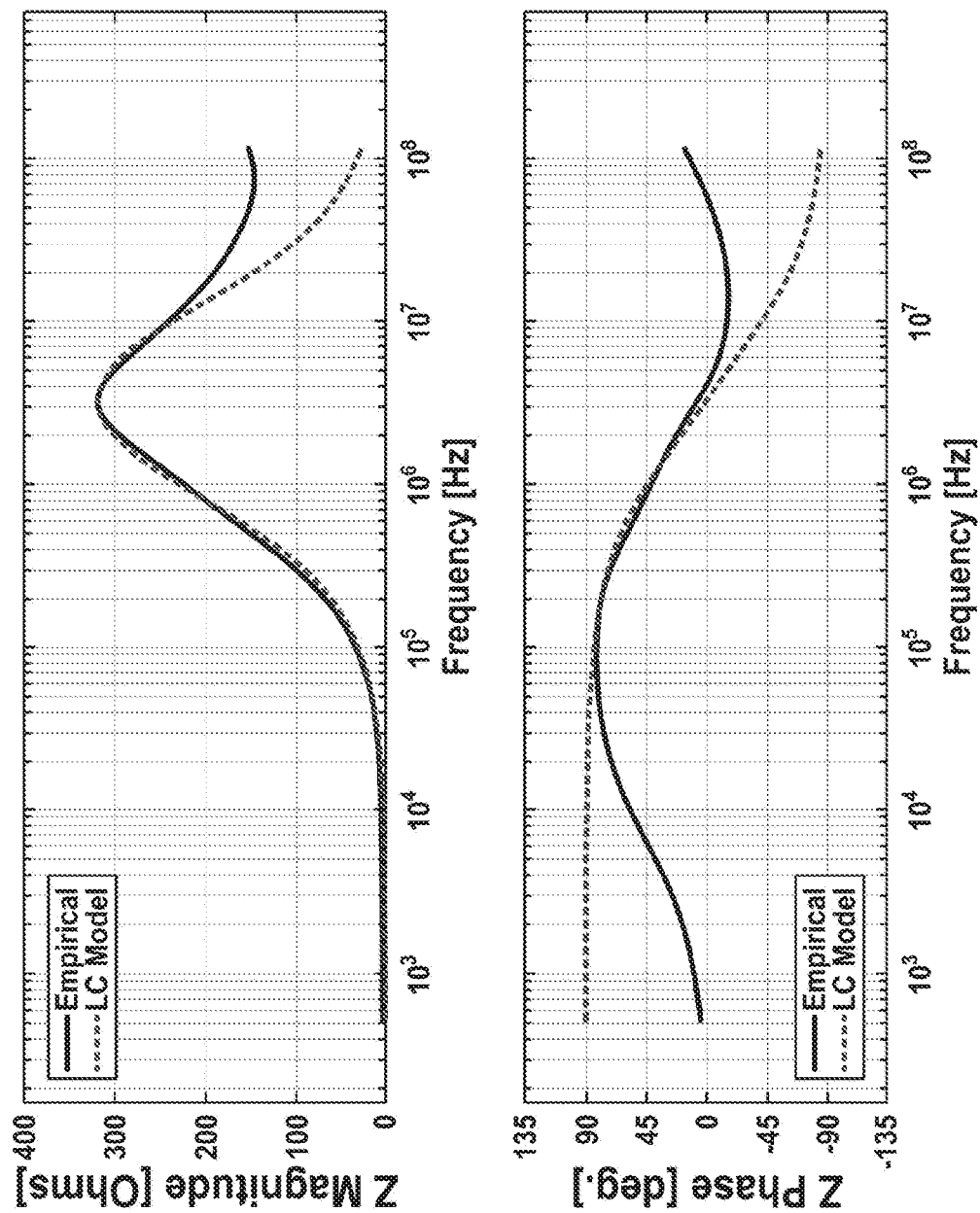
FIG. 6 shows an empirical impedance and a simulated impedance profile of an ideal parallel RLC filter, such as that incorporated into the exemplary CT-snubber embodiment described herein.

The CT-snubber prototype shown in FIG. 5 was measured across a frequency range of 500 Hz to 100 MHz. The resulting empirical impedance profile is shown in FIG. 6, overlaid with the impedance profile of an ideal parallel RLC network. It should be noted that this measurement represents the impedance of only a portion of the CT-snubber: the parallel RLC filter combined in series with the burden resistor (RB). The ferrite-based structure used to magnetically couple the CT-snubber to the main power circuit is not characterized in this step. Measurement of the AC-coupling interface presents some challenges, due to the reduced impedance magnitude reflected through the coupling, as well as the frequency dependent characteristics of the magnetic core material used in the coupling mechanism. However, to first order, the insertion impedance of the CT-snubber within the main power circuit can be viewed as the impedance profile shown in FIG. 6, with the magnitude divided by factor of 100 (for a 10-turn secondary winding on the coupler). That is, FIG. 6 shows empirical impedance curves for CT-snubber prototype and parallel RLC model overlay with $R_P=318\Omega$, $L_P=47.8$ μH, $C_P=50$ pF.

It should also be noted that the magnetic material employed in the design of the CT-snubber is known to play a significant role in determining the snubbing efficacy of the system. In addition to the frequency-dependent impedance introduced by the RLC filter (212), the magnetic coupler (204) also provides a measure of frequency-dependent impedance to the primary-side circuit. This influence is difficult to utilize as a design variable, since unlike the RLC filter, the frequency dependence of the coupler cannot be predicted by linear circuit analysis but instead is convolved with the material properties of the magnetic core. Nevertheless, the magnetic coupler can significantly enhance the snubbing effectiveness of the system, especially in the Megahertz frequency range, at which point most high-permeability magnetic materials (the type useful in the design of the CT-snubber) exhibit a significant increase in impedance.

A study of the available commercial magnetic materials which might be useful for the design of the CT-snubber has been conducted, and it was determined that two separate approaches are available for the design of the CT-snubber. See especially, A. J. Hanson, J. A. Belk, S. Lim, C. R. Sullivan, and D. J. Perreault, "Measurements and Performance Factor Comparisons of Magnetic Materials at High Frequency," *IEEE Trans. Power Electron.*, vol. 31, no. 11, pp. 7909-7924, 2016. The first approach is to use a ferrite material with a high-permeability (in the range of 2000-3000). As described by Snoek's Law, high-permeability soft ferrites become more dissipative with increased frequency than low-permeability soft ferrites. In the case of the CT-snubber this increased dissipative behavior translates to increased snubbing effectiveness. Therefore, when using a high-permeability magnetic material in the CT-snubber design, the magnetic material will provide the bulk of the snubbing influence and the role of the RLC filter (212) is reduced to "tuning" or adjustment of the location of the suppression band. This design approach is useful for low-frequency applications because the magnetizing inductance of CT will be significant, improving the ability of the CT-snubber to measure long-duration pulses. The second approach is to use a magnetic material with lower permeability (in the range of 100-500). Such materials generally are much less dissipative at high frequencies than high-permeability soft ferrites, which translates to reduced snubbing effectiveness in the case of the CT-snubber. Therefore, when using a low-permeability magnetic material in the CT-snubber design, the magnetic material will provide little (if any) snubbing influence, and the RLC filter (212) is the primary means of suppressing high-frequency ringing. This design approach is especially useful for very high-frequency applications, because the range of the suppression band can be tightly controller. One disadvantage of this approach is limited ability to measure current at low frequencies, due to the limited magnetizing inductance of the magnetic coupler.

Known snubbers, such as one taught by Kim et al. do not provide the snubbing and simultaneous current measurement as in the presently disclosed principles. For example, Kim's approach lacks any type of magnetic core and uses instead winding in the printed circuit board (PCB) which is coupled through the air to the terminals of the primary circuit by proximity. This approach has several disadvantages compared to the presently disclosed principles, most of which accrue through the lack of a magnetic core. First, omission of the magnetic core means that the coupling between the primary and secondary circuits is sensitive to the geometry of the circuit. This approach may require a much larger secondary coil than would be required with a magnetic core, and the coupling effectiveness may be reduced if the relative positions of the primary and secondary circuit are changed. Another more serious problem is that the lack of a magnetic core makes it impractical to effectively measure the primary side current. Thus, Kim et. al do not claim any measurement capability for their proposed approach; only snubbing capability. The lack of a magnetic core means that the magnetizing inductance of the coupling is so small that only very short pulses (less than one microsecond) could be reliably measured. In contrast, the CT-snubber has been demonstrated to provide high-frequency snubbing capability simultaneously with measurement capability of pulses up to 100 microseconds.

The measured impedance profile of the CT-snubber presented in FIG. 6 (solid line) was imported into MATLAB and curve-fit to the impedance profile of an ideal parallel RLC network (dashed line). It should be noted that the experimental curves show a low-frequency phase near zero, while the model predicts a low-frequency phase at 90°. The reason for this discrepancy is that the model represents an ideal parallel RLC, while the actual circuit contains an RLC network in series with a 2Ω burden resistor. Nevertheless, the RLC model obtained through curve fitting shows a reasonably good agreement with the measured curves up to about 10 MHz, where the non-linear characteristics of the inductor core likely begin to influence the measured impedance profile.

The impedance profile of FIG. 6 can be used to estimate the influence that would be exerted on the main power circuit by the addition of the CT-snubber. This is the insertion impedance (Zin), or "loading" of the main power circuit due to the CT-snubber. As described previously, the CT-snubber is intended to minimize the insertion impedance in the frequency range that represents the intended operation frequencies of switch-mode converters, and to maximize the insertion impedance in the high-frequency range that is occupied by undesirable, near-RF dynamics caused by parasitic energy exchange, especially in systems with fast-switching WBG semiconductors. First, this analysis demonstrates that an insertion impedance of approximately 20 mΩ would be reflected into the main power circuit at DC and low-frequency AC. This means that the nominal behavior of the converter should be largely unaffected by the introduction of the CT-snubber, since most power electronics applications involve effective average power transfer in this frequency range (DC/DC converters and line-frequency inverters, for example). Second, impact to the main power circuit at a range of switching frequencies up to 100 kHz would be modest, with an insertion impedance of 330 mΩ at the high end of this frequency range. Third, any content in the 1-10 MHz range would be subject to the insertion impedance of the "suppression band", which peaks at approximately 3.2Ω for this particular design. Spectral content in this range is usually unintended and un-desired behavior for high-power SiC-based power electronics converters. Thus, the substantial impact expected in this frequency range due to the relatively high insertion impedance is expected to substantially improve the overall system dynamics of such a system, provided that the thermal behavior of the CT-snubber is sufficiently robust.

Figure 7A:
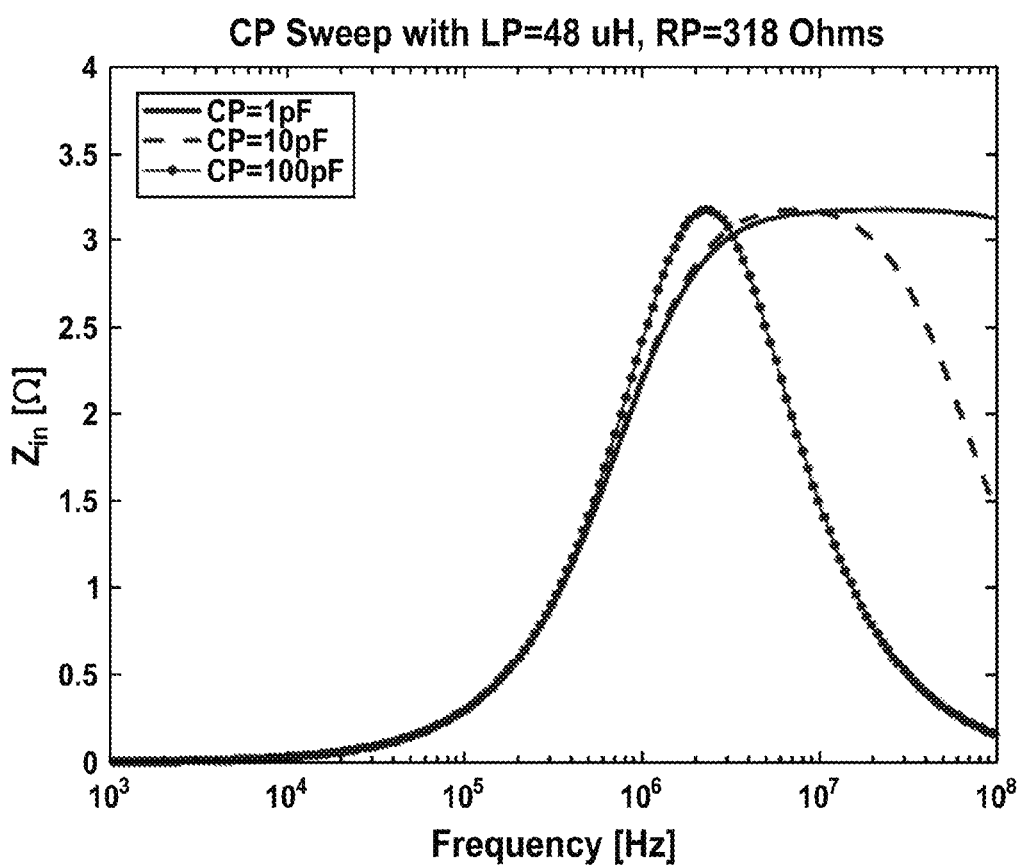
FIG. 7A shows a simulated plot of the frequency-dependent insertion impedance ($Z_{in}$) of the CT-snubber when the filter capacitance ($C_P$) is varied across a range from 1 pF to 100 pF.
Figure 7B:
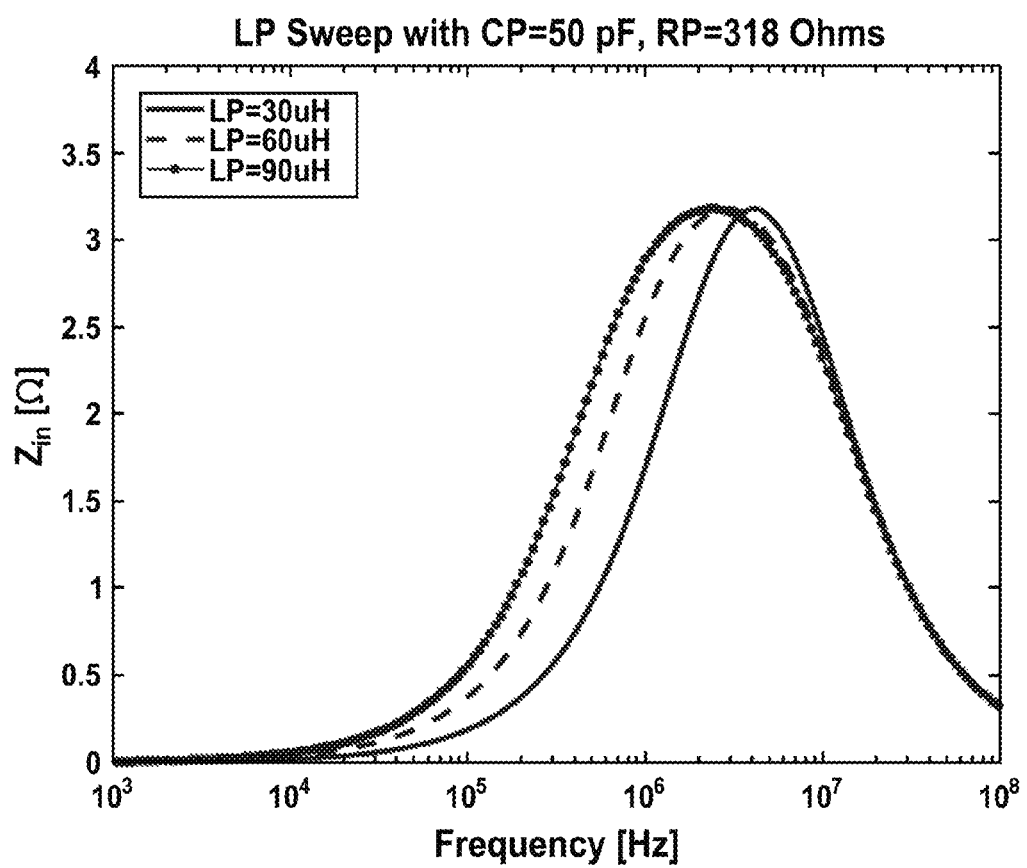
FIG. 7B shows a simulated plot of the frequency-dependent insertion impedance ($Z_{in}$) of the CT-snubber when the filter inductance ($L_P$) is varied across a range from 30 pH to 90 µH.
Figure 7C:
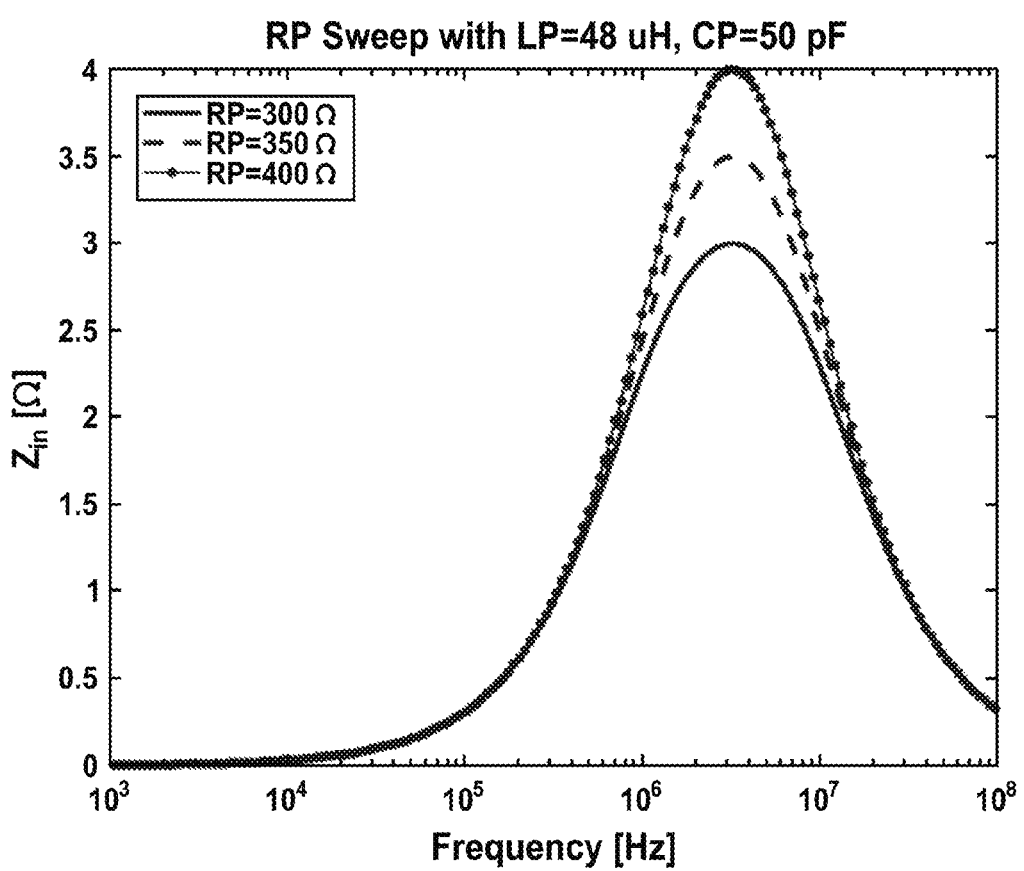
FIG. 7C shows a simulated plot of the frequency-dependent insertion impedance ($Z_{in}$) of the CT-snubber when the filter resistance ($R_P$) is varied across a range from 300Ω to 400Ω.

While certain values of $R_P$, $L_P$, and $C_P$ are shown in FIG. 6, a CT-snubber design according to principles of the present disclosure is not limited to these specific values. Simulation-based parametric sweeps have been performed to identify the range of RLC values which are expected to be effective in the suppression of the high-frequency spectral content commonly found in WBG-based systems. This analysis involved sweeping each of the three RLC filter parameter values individually, while holding the remaining two parameter values constant at the nominal values presented herein. The resulting filter configurations were evaluated in simulation to determine whether the frequency-dependent insertion impedance of each configuration would be suitable for the operation of the present invention. Specifically, it is desired for Zin to remain below 0.5Ω at frequencies below 100 kHz; and for Zin to be greater than 2Ω for the frequency range 1-10 MHz. This analysis has shown that the following component ranges are expected to be effective in the present invention: $C_P$ values at 100 pF and below, with no lower limit (as shown in FIG. 7A), $L_P$ values in the range of 30 μH to 90 μH (as shown in FIG. 7B), and $R_P$ values above 300Ω with no upper limit (as shown in FIG. 7C). An embodiment of the present invention with component values in these ranges is likely to be as effective as the example design provided here. In addition, the insertion impedance values suggested in this application are not limited to the specific values indicated. As discussed above, for example, the insertion impedance may be selected as 1.05 and 10 times the measurement-band insertion impedance or may even vary from that range depending on the application.

Figure 8:
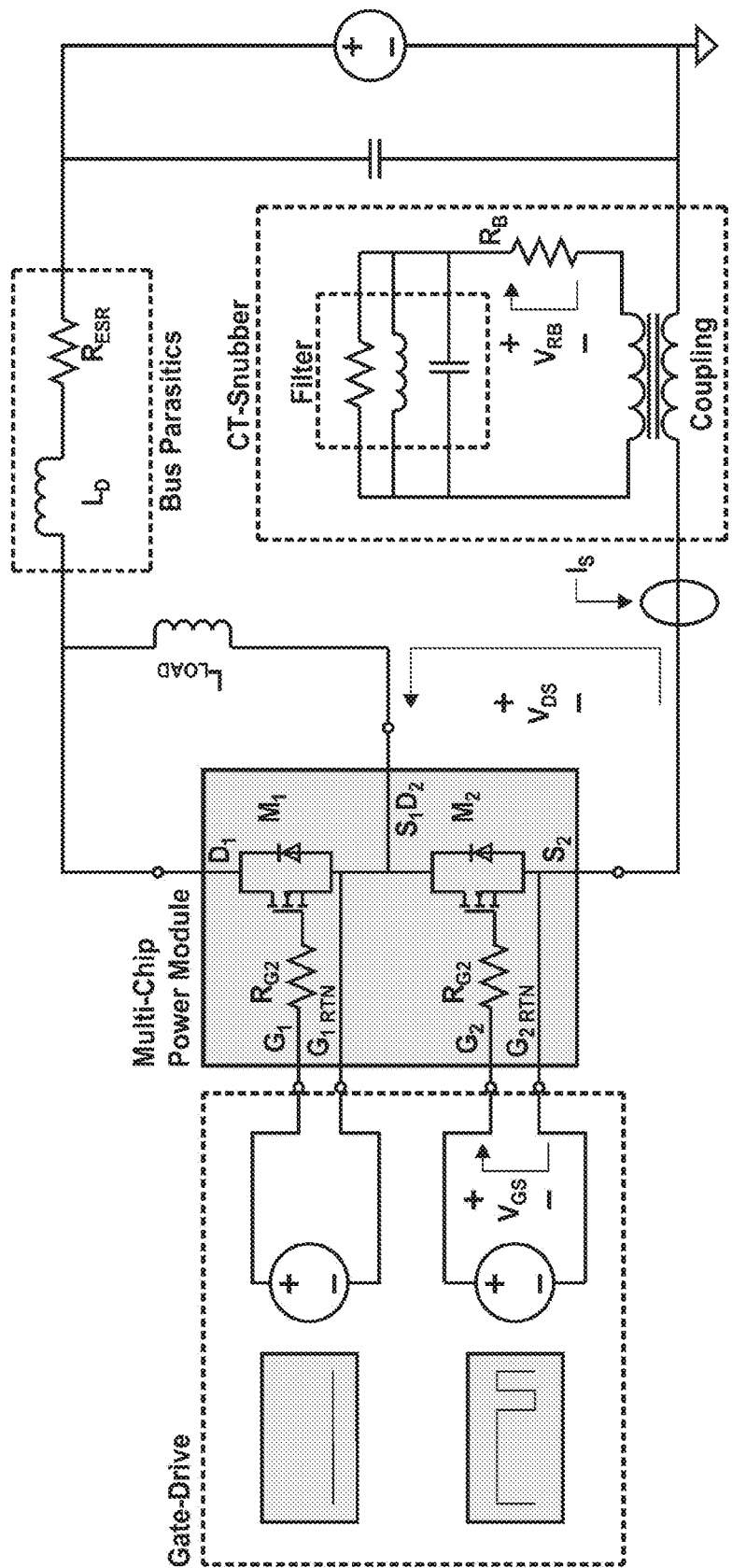
FIG. 8 is a schematic of a clamped-inductive load (CIL) test stand, with CT-snubber implementation.

FIG. 8 is a Clamped Inductive Load (CIL) test stand schematic that includes the CT-snubber implementation described herein.

The second portion of the empirical analysis performed for this effort involved introducing the CT-snubber into the high-power Clamped Inductive Load (CIL) test stand designed specifically for transient evaluation of SiC multi-chip power modules and presented in FIG. 8. An annotated picture of the hardware realization of this test stand is presented in FIG. 9, which includes an indication of how the CT-snubber is integrated into the apparatus. This test stand incorporates a high-performance half-bridge SiC module rated at 1.2 kV and 350 A, as the active semiconductor element. During the CIL test sequence, the lower switch (M2) is actively gated, and the upper switch (M1) is biased off such that the anti-parallel diodes in this position can serve as the freewheeling path for the inductive current during the switch-off interval. This test stand also contains provisions for accurate measurement of several important quantities associated with the actively-gated switch. For example, the drain-source voltage (VDS), gate-source voltage (VGS) of M2 are monitored with single-ended high-bandwidth voltage probes. The source current (IS) of M2 is monitored by a high-bandwidth current-viewing-resistor (shunt) positioned adjacent to the location of the CT-snubber. This provides a reference current measurement, which is used in this analysis to evaluate the current-sensing capabilities of the CT-snubber.

Figure 9:
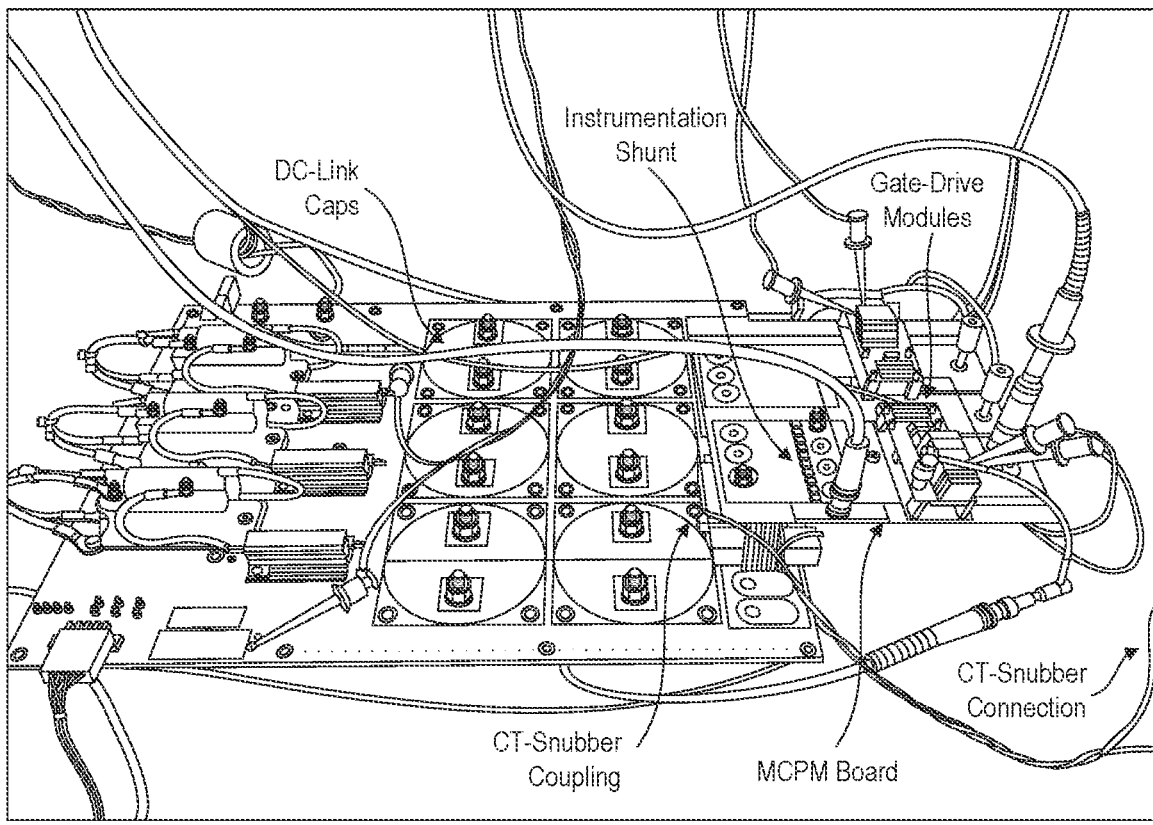
FIG. 9 shows the physical realization of a CIL test stand for testing a prototype CT-snubber according to principles of the present disclosure.

The large printed circuit board (PCB) shown in FIG. 9 represents an isolated energy storage bank, and the smaller "module board" contains the interface to the device under test (DUT) as well as the necessary metrology interfaces described previously. In this figure, the multi-chip module in use is not visible, as it is mounted to the under-side of the module board. The two switch positions are independently controlled by the two gate-drive modules shown. The instrumentation shunt shown in this picture is a carefully-calibrated 100 mΩ resistor composed of ten 1Ω precision (1% tolerance) resistors which span the entire width of the negative bus plane. The output of this shunt is monitored by an oscilloscope via coaxial connection to the PCB. The coupling of the CT-snubber to the test stand is also illustrated in this figure.

This preliminary evaluation was performed with the CT-snubber coupled to the power bus outside the module, as shown here, for proof of concept. The coupling mechanism is constructed from a pair of high-permeability ferrite U-shaped-cores with a 10-turn secondary winding. The single-turn primary winding consists of an aluminum stand-off which also serves as the mechanical mounting between the main board and the module board. The small PCB which contains the burden resistor and filter portion of the CT-snubber is attached to the end of the wire leads extending from the coupling mechanism. For evaluation of the CT-snubber concept, a set of experiments was conducted at a bus voltage of 600V and a load current of 100 A.

Figure 10:
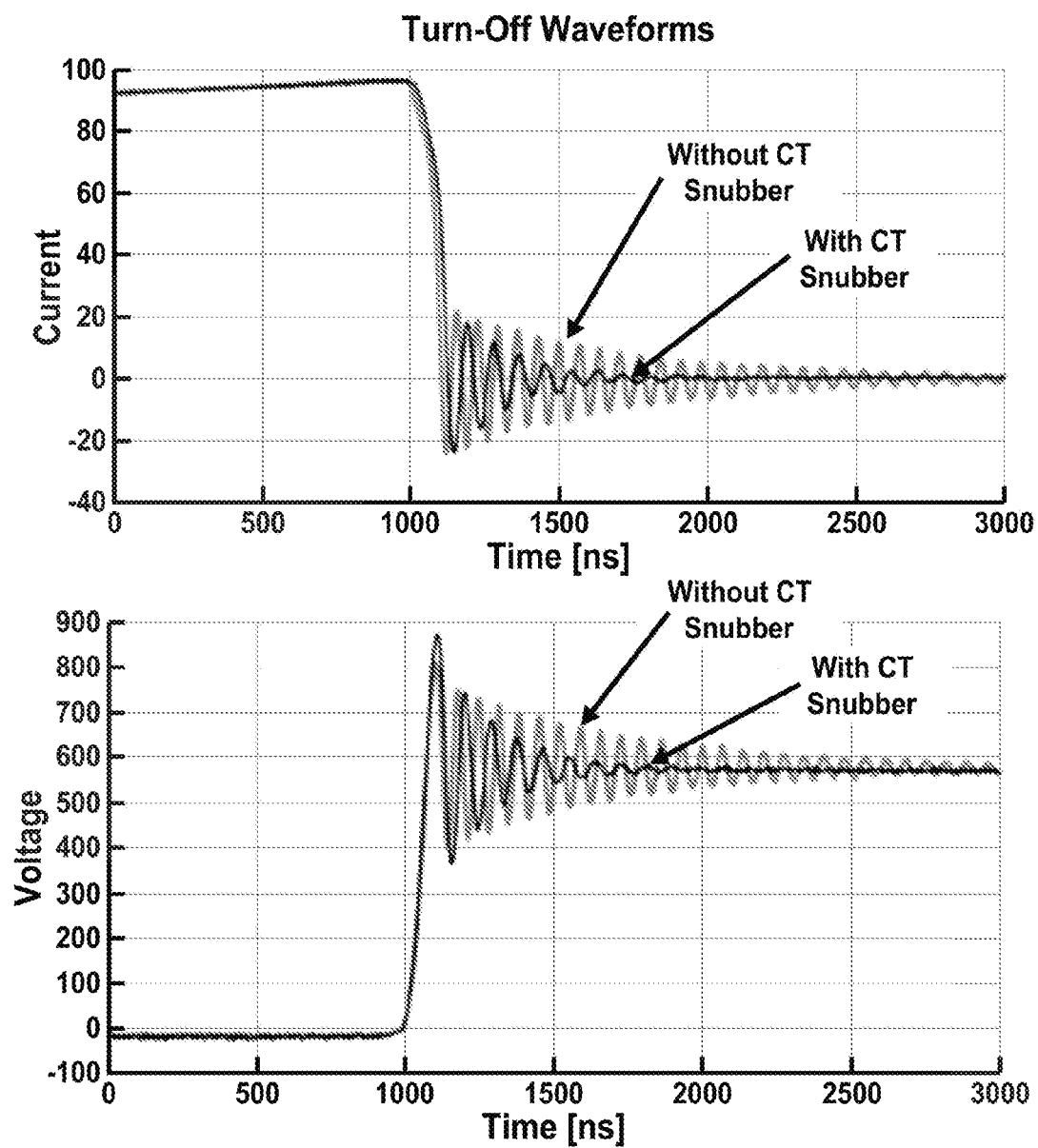
FIG. 10 shows experimental waveforms at turn-off, with and without the CT-snubber in place: (a) current waveforms, (b) voltage waveforms.
Figure 11:
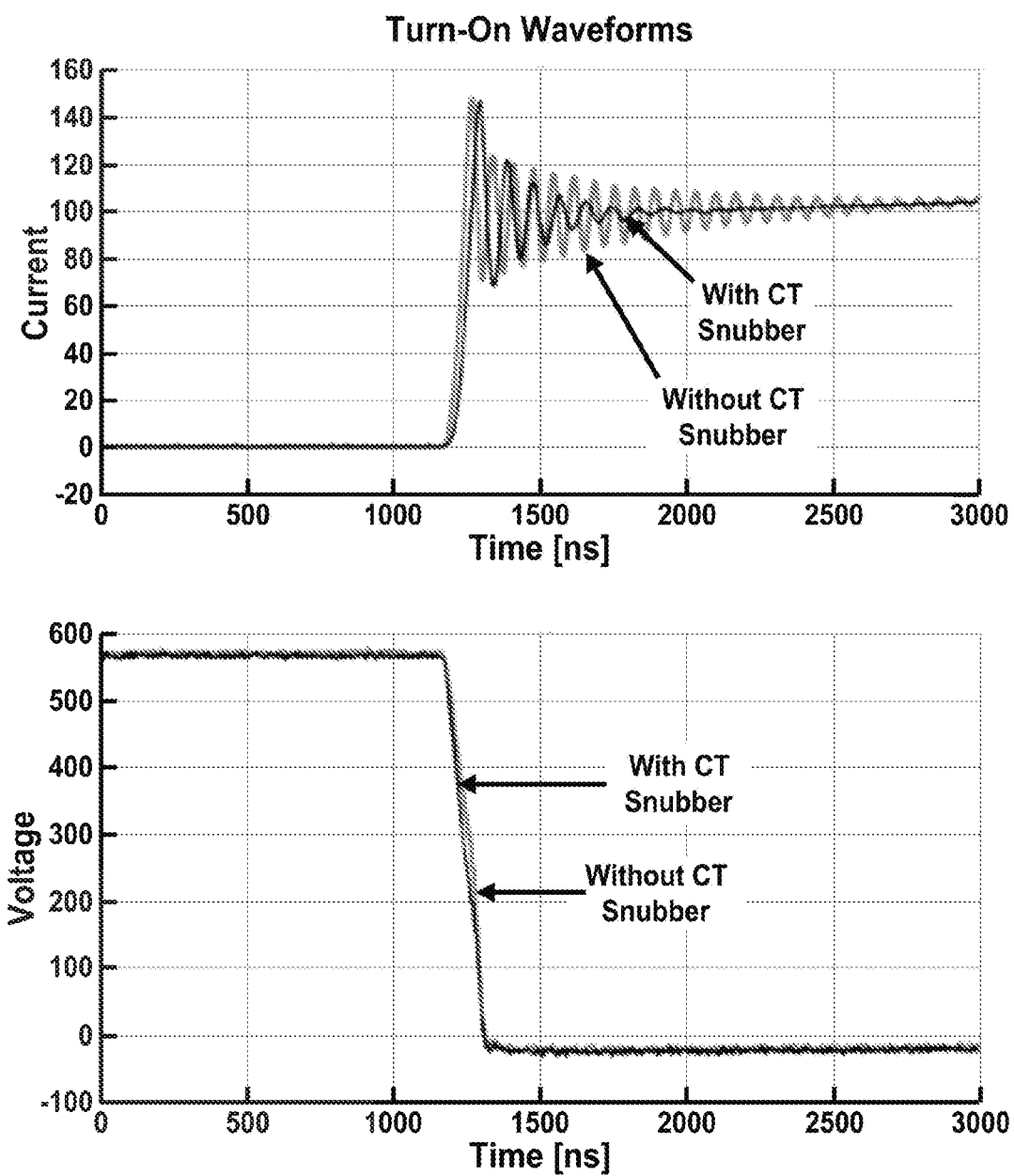
FIG. 11 shows experimental waveforms at turn-on, with and without the CT-snubber in place: (a) current waveforms, (b) voltage waveforms.

The CIL experiment was first executed without the CT-snubber in place in order to establish a baseline for the dynamics of the test stand. The expanded board-to-board spacing required for insertion of the CT-snubber coupling mechanism was preserved for the baseline case; this has a measurable effect on the inductance of the power loop bus and contributes to undesirable ringing in the presence of fast-changing current and voltage signals. The results of these experiments are demonstrated in FIG. 10 and FIG. 11. FIG. 10 shows experimental turn-off waveforms with and without the CT-snubber in place: (a) drain current waveforms, (b) drain-source voltage waveforms. In FIG. 10, significant ringing at approximately 15 MHz is apparent for the baseline configuration (more than 25 cycles of oscillation are observable); while the CT-snubber configuration demonstrates significantly reduced ringing (fewer than 10 cycles of oscillation are observable). FIG. 11 demonstrates the same type of transient comparison, but at the semiconductor turn-on condition. FIG. 11 shows experimental turn-on waveforms with and without the CT-snubber in place: (a) drain current waveforms, (b) drain-source voltage waveforms. As in the previous (turn-off) case, this comparison demonstrates a reduced number of oscillatory cycles for the CT-snubber configuration compared to the baseline case without the CT-snubber. Using the log-decrement method, the damping ratio of the voltage waveform can be calculated from these empirical results and used to quantify the damping improvement achieved with the CT-snubber. For example, at turn-off, the baseline configuration was determined to have a damping ratio of 0.034 (extremely underdamped). The turn-off voltage waveform for the CT-snubber configuration has a calculated damping ratio of 0.208, approximately six times higher than the baseline case.

Figure 12:
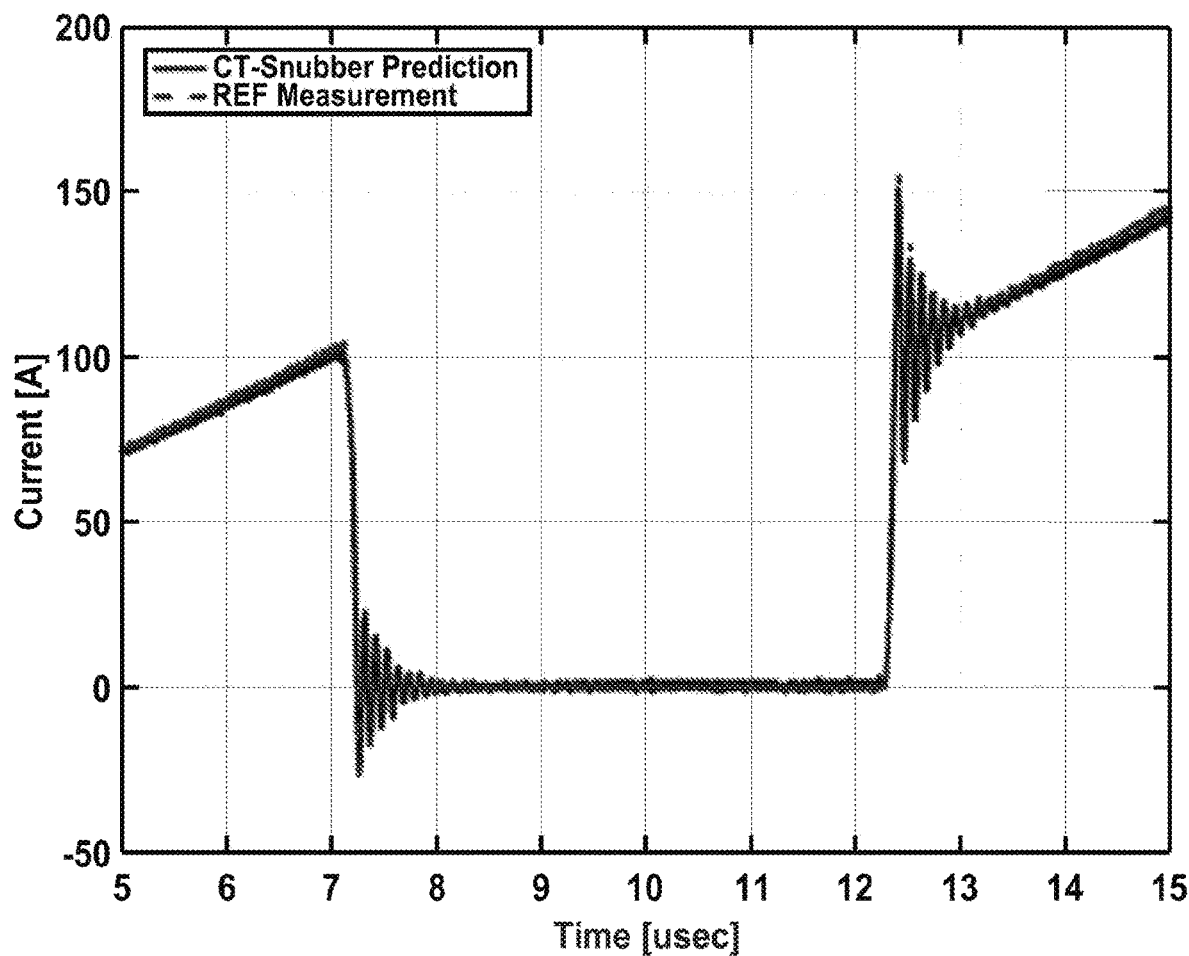
FIG. 12 illustrates the current measurement capabilities of the present invention by comparing the signal from a reference instrumentation shunt (dashed trace) to the current signal predicted by the CT-snubber (solid trace).

The final goal of this empirical study was to investigate the accuracy of the CT-snubber for the purpose of measuring the primary circuit current. As identified previously, spectral components of the primary current signal appearing in the measurement band are expected to be captured with good fidelity by the CT-snubber as voltage transients across the burden resistor. In the experimental procedures outlined above, a high-voltage voltage probe was used to sample the instantaneous voltage across the burden resistor ($R_B$) of the CT-snubber so that the current projection of the CT-snubber could be compared to the reference current measurement provided by a calibrated instrumentation-grade current transducer. In this case, the CT-snubber inverse measurement gain was calculated to be 50 ($I_P/V_{SENSE}=N_S/R_B$). After applying this scaling relationship to the voltage measured across the burden resistor, the resulting current projection from the CT-snubber can be compared to the reference current measurement. FIG. 12 shows a comparison of module current using the reference current measurement (red trace) and the CT-snubber prediction (blue trace). This figure demonstrates that the CT-snubber provides very good agreement with the reference current measurement.

Table 1, below, shows a synopsis of the previously described experimental results illustrating the effectiveness of a CT-Snubber for suppression of high-frequency oscillation at semiconductor turn-off, according to principles of the present disclosure.

| Configuration | Ringing Frequency | Damping Ratio |
| --- | --- | --- |
| Without Snubber | 14.9 MHz | 0.034 |
| With Snubber | 11.1 MHz | 0.208 |
| | | 6.1X Increase |

As described herein, a technique for adding two complementary features to power electronics circuits based on multi-chip power modules: high-bandwidth current measurement and ringing suppression may be provided. The design of the "CT-snubber" device, which can be viewed as an extension of the traditional current transformer, incorporates an additional filter network which can be tuned to mitigate the undesirable parasitic-induced ringing of the type commonly observed in wide band-gap applications during high-edge-rate switching transients. Preliminary empirical results from a prototype CT-snubber designed as part of this effort indicate that this concept is viable both as a current measurement apparatus, as well as a means for improving the transient response of power electronics applications. Further, it is believed that this type of circuit could be readily integrated into the housing of multi-chip modules, thereby simultaneously realizing improved dynamic performance and in-situ current sensing suitable for application control.

A CT-Snubber as described herein may allow for current sensing of "desired" spectral content and suppression of "undesired" spectral content; is amenable to implementation within multi-chip power modules and is useful for SiC and other WBG-based systems; and can eliminate the need to create a bus constriction for current measurement. The proposed CT-snubber may have a smaller form factor compared to the combination of other circuits which are traditionally used to implement ringing suppression and current measurement separately. As a result, the CT-snubber can be embedded into the MCPM geometry, taking advantage of an existing bus constriction that is necessary at the interface between the semiconductor device packaging and the remainder of the power electronics converter.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

Throughout this application, various publications may have been referenced. The disclosures of these publications in their entireties are hereby incorporated by reference into this application in order to more fully describe the state of the art to which this invention pertains, including:

[1] A. N. Lemmon, A. Shahabi and K. Miskell, "Multi-branch inductance extraction procedure for multi-chip power modules," in *Proc. Workshop on Wide Bandgap Power Devices and Applications (WiPDA)*, Fayetteville, A R, 2016, pp. 95-100.

[2] S. Ziegler, R. C. Woodward, H. H. C. Iu and L. J. Borle, "Current Sensing Techniques: A Review," in *IEEE Sensors Journal*, vol. 9, no. 4, pp. 354-376, April 2009.

[3] S. Ziegler, "New current sensing solutions for low-cost high-power-density digitally controlled power converters" Ph.D. dissertation, school of Elect., Electronics and Comp. Engin., The Univ. of Western Australia, Perth, Australia, 2009.

[4] J. A. Ferreira, W. A. Cronje and W. A. Relihan, "Integration of high frequency current shunts in power electronic circuits," in *IEEE Transactions on Power Electronics*, vol. 10, no. 1, pp. 32-37, January 1995.

[5] C. M. Johnson and P. R. Palmer, "Current measurement using compensated coaxial shunts," in *IEEE Proceedings of Science, Measurement and Technology*, vol. 141, no. 6, pp. 471-480, November 1994.

[6] Kwok-Wai Ma and Yim-Shu Lee, "Technique for sensing inductor and DC output currents of PWM DC-DC converter," in *IEEE Transactions on Power Electronics*, vol. 9, no. 3, pp. 346-354, May 1994.

[7] N. McNeill, N. K. Gupta and W. G. Armstrong, "Active current transformer circuits for low distortion sensing in switched mode power converters," in *IEEE Transactions on Power Electronics*, vol. 19, no. 4, pp. 908-917, July 2004.

[8] P. A. Tipler, An introduction to the Hall effect, Bell Technologies, Inc., 2005. [Online]. Available: http://www.fwbell.com.

[9] R. S. Popovic, Z. Randjelovic, and D. Manic, "Integrated Hall-effect magnetic sensors," in *Sensors and Actuators A: Physical*, vol. 91, pp. 46-50, 2001.

[10] J. Kim, A Damping Scheme for switching Ringing of Full SiC MOSFET by Air Core PCB circuit, in *IEEE Transactions on Power Electronics*, Issue 99, 2017.

[11] A. J. Hanson, J. A. Belk, S. Lim, C. R. Sullivan, and D. J. Perreault, "Measurements and Performance Factor Comparisons of Magnetic Materials at High Frequency," *IEEE Trans. Power Electron.*, vol. 31, no. 11, pp. 7909-7924, 2016.

[12] A. Lemmon, R. Cuzner, J. Gafford, R. Hosseini, M. Mazzola, "Methodology for Characterization of Common-Mode Conducted Electromagnetic Emissions in Wide-Band-Gap Converters for Ungrounded Shipboard Applications," in *IEEE Journal of Emerging and Selected Topics in Power Electronics*, vol. PP, no. 99, pp. 1-16, Jun. 2017.

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments but should be defined only in accordance with the following claims and their equivalents.

What is claimed is:

1. A current transformer circuit for current measurement and ringing suppression, comprising:
    a magnetic core current transformer comprising a magnetic core material and having a winding; and
    an RLC filter comprising a capacitor having a capacitance Cp, an inductor having an impedance Lp and a resistor having a resistance Rp, the RLC filter connected to the winding of the magnetic core current transformer and a burden resistor;
    wherein the Cp, Lp and Rp and the magnetic core material are selected such that combined influence of the Cp, Lp and Rp and the magnetic core material suppress ringing in a target frequency range; and
    wherein the current measurement is observed from the voltage expressed across the burden resistor.

2. The current transformer circuit of claim 1, wherein the magnetic core material is a ferrite material.

3. The current transformer circuit of claim 1, wherein permeability of the magnetic core material is in a range of 2000-3000.

4. The current transformer circuit of claim 1, wherein permeability of the magnetic core material is in a range of 100-500.

5. The current transformer circuit of claim 1, wherein the magnetic core material has a permeability matched to a ringing frequency to be suppressed.

* * * * *

UNITED STATES PATENT AND TRADEMARK OFFICE
CERTIFICATE OF CORRECTION

PATENT NO. : 11,913,974 B2
APPLICATION NO. : 17/044133
DATED : February 27, 2024
INVENTOR(S) : Andrew N. Lemmon and Ali Shahabi It is certified that error appears in the above-identified patent and that said Letters Patent is hereby corrected as shown below:

On the Title Page

Item (56), Column 2 In "Other Publications", Line 1, delete "Emmon" and insert -- Lemmon --

Signed and Sealed this
Seventh Day of May, 2024

Katherine Kelly Vidal
*Director of the United States Patent and Trademark Office*